US009475307B2

(12) United States Patent
Cridland (10) Patent No.: US 9,475,307 B2
(45) Date of Patent: Oct. 25, 2016

(54) INKLESS PRINTING METHOD

(75) Inventor: John Cridland, Cheshire (GB)

(73) Assignee: DATALASE LIMITED, Widnes Cheshire (GB)

( * ) Notice: Subject to any disclaimer, the term of this patent is extended or adjusted under 35 U.S.C. 154(b) by 0 days.

(21) Appl. No.: 14/233,881

(22) PCT Filed: Jul. 23, 2012

(86) PCT No.: PCT/GB2012/051763
§ 371 (c)(1),
(2), (4) Date: Feb. 28, 2014

(87) PCT Pub. No.: WO2013/014436
PCT Pub. Date: Jan. 31, 2013

(65) Prior Publication Data
US 2014/0160221 A1    Jun. 12, 2014

(30) Foreign Application Priority Data

Jul. 22, 2011    (GB) .................................. 1112645.5

(51) Int. Cl.
*B41J 2/44*        (2006.01)
*B41M 5/28*       (2006.01)
*B41M 5/34*       (2006.01)
*G03C 1/73*        (2006.01)
*G03F 7/025*      (2006.01)

(52) U.S. Cl.
CPC ................. *B41J 2/44* (2013.01); *B41M 5/285* (2013.01); *B41M 5/34* (2013.01); *G03C 1/73* (2013.01); *G03F 7/025* (2013.01)

(58) Field of Classification Search
CPC .......... B41J 2/45; B41J 2/473; B41J 2/4753; B41J 2/525
USPC ....... 347/224, 225, 232, 233, 240, 251–254; 430/332–335, 346, 363, 508, 559, 927
See application file for complete search history.

(56) References Cited

U.S. PATENT DOCUMENTS

| | | | |
|---|---|---|---|
| 5,149,617 A | 9/1992 | Liu | |
| 6,291,065 B1 * | 9/2001 | Poetsch et al. | ............... 428/363 |
| 6,298,187 B1 * | 10/2001 | Waarts et al. | ................... 385/37 |
| 2010/0296127 A1 * | 11/2010 | Barndt et al. | ................ 358/3.24 |
| 2011/0151384 A1 * | 6/2011 | Walker | ..................... B41M 5/28 |
| | | | 430/338 |

FOREIGN PATENT DOCUMENTS

| | | | | |
|---|---|---|---|---|
| WO | 2009093028 A2 | 7/2009 | | |
| WO | 2010001172 A1 | 1/2010 | | |
| WO | WO 2010112940 A1 * | 10/2010 | ............... | G03C 1/73 |
| WO | 2011089447 A1 | 7/2011 | | |

* cited by examiner

*Primary Examiner* — Shelby Fidler
(74) *Attorney, Agent, or Firm* — Barlow, Josephs & Holmes, Ltd.

(57) ABSTRACT

The present invention relates to a method of marking a substrate that comprises a color forming material, comprising the steps of: activating a region of the substrate so as to transform it from an inactive, low reactive state to an active, high reactive state; irradiating a part of the activated region with an initial color changing radiation to effect an initial color change to a first color; and irradiating a part of the substrate that has been changed to the first color with a high power density beam of visible electromagnetic radiation to effect a further color change of the irradiated region to a second color.

9 Claims, 3 Drawing Sheets

INKLESS PRINTING METHOD

The present invention relates to an inkless printing method and associated apparatus. In particular, it relates to one wherein a high energy density beam of visible radiation is used to effect a colour change.

Inkless printing is an alternative to traditional printing techniques, wherein a pigment is applied directly to a substrate. Broadly speaking, these methods utilise a substrate whose physical properties (in particular its colour) can be altered upon irradiation with patterns of radiation. Typically, the substrate is stored and viewed under normal ambient temperature and light conditions and therefore the substrate must be stable under ambient visible light conditions.

Inkless digital printing systems as known in the art typically employ a substrate with a white base layer and a coating layer whose colour can be altered. The coating may, for example, comprise a diacetylene (DA) material. In an inactive state this material is transparent to visible wavelengths hence the coating and substrate is the same colour as the base layer, for example white. To make the coating sensitive to NIR radiation such that it can be heated using radiation, a near infrared (NIR) absorber, which is also transparent in the visible range of the spectrum, is added to the coating formulation. The NIR absorber absorbs incident NIR radiation, heats up and transfers this energy to the inactive DA colour former in the coating by thermal conduction thus turning it into an active form. In this way it is possible to create a white substrate that can be activated and subsequently transformed into multiple colours.

Typically a colour change of the colour forming material is achieved by an initial polymerisation followed by heating the colour forming material and its final colour is dependent upon the temperature it is heated to. The initial polymerisation is a photonic process and therefore there is generally a wavelength threshold: radiation with a wavelength below this threshold can effect the polymerisation whereas radiation with a wavelength above this threshold cannot. For diacetylene materials, ultra violet radiation with a wavelength below around 380 nm, and preferably below 300 nm, is required.

One way of effecting a change in the colour of the colour forming material after polymerisation may be to irradiate it with electromagnetic radiation and, typically, prior art methods have employed radiation outside of the visible range for colour changing the substrate since it is desirable for substrates to be stable in the presence of ambient visible light. For example, radiation emitted either side of the visible range, namely infrared, near infrared and ultra violet radiation may be used.

Whilst ultra violet radiation can be used to effect the final colour change, for diacetylenes this is rather inefficient. Some colours require such high temperatures that it would be impractical to use ultra violet radiation alone. Therefore, particularly since the substrate typically has an IR or NIR absorber in thermal contact with the diacetylene, IR and/or NIR is typically used for further colour change of diacetylenes after polymerisation.

However, with some colour forming materials (for example diacetylenes) the process of heating the coating layer using NIR radiation to effect a colour change can also activate small residual amounts of inactive colour forming material to the active state and this can have a deleterious effect on its long term light stability.

Furthermore, certain colour formers require a higher temperature to form some colours (for example yellow) than is required for other colours (such as red). These high temperatures can lead to damage or decomposition of the substrate and binders in the coating. This is particularly the case when NIR radiation is used for the colour transformation process. The NIR absorber absorbs NIR radiation from the laser and transfers this energy, as heat, not only to the diacetylene coloured material but also to surrounding material such as binders and substrate, together with any inactive colour forming material.

If the incident colour transforming radiation has a non uniform intensity distribution then different regions of the colour forming material will receive different quantities of energy since regions will receive energy in proportion to the intensity distribution. For example, if the incident colour transforming radiation has a Gaussian like distribution, the region of the substrate that corresponds to the central region of the intensity distribution will receive more energy than the outer region. Consequently, the central region will reach a higher temperature than the outer region. When attempting to effect a colour change from a first colour to another, target colour, different target colours have different threshold energy densities and temperatures. Therefore, supplying different regions of the colour changing material with different quantities of energy, as in the case of a beam with a Gaussian intensity distribution, may result in an individual spot forming which comprises of a plurality of different colours. One way to overcome this problem may be to employ a colour changing radiation beam with a square uniform intensity distribution.

It is therefore an object of the present invention to provide a solution that at least partially overcomes or alleviates the problems described above.

According to a first aspect of the present invention there is provided a method of marking a substrate that comprises a colour forming material, said method comprising the steps of: activating a region of the substrate so as to transform it from an inactive, low reactive state to an active, high reactive state; irradiating at least a part of the activated region with an initial colour changing radiation to effect an initial colour change to a first colour; and irradiating at least a part of the substrate that has been changed to the first colour with a high power density beam of visible electromagnetic radiation to effect a further colour change of the irradiated region to a second colour.

Such a method allows for inkless printing onto a substrate and enables a level of control over the marking process.

It is surprising that visible radiation can be used to effect a colour change, given that the substrate is required to be stable under ambient light conditions. However, by using a sufficiently high power density beam of visible radiation a colour change of the colour forming material can be achieved whilst retaining the long time stability of the substrate. Furthermore, as will be set out in more detail below, there are significant advantages to using visible light over ultra violet and/or infra red light.

Preferably, the power density of the beam of visible electromagnetic radiation is at least 10 $Wcm^{-2}$ and more preferably it is at least 100 $Wcm^{-2}$. Preferably, the energy density of the beam of visible electromagnetic radiation is at least 0.1 $Jcm^{-2}$ and more preferably it is at least 0.5 $Jcm^{-2}$.

Preferably, when the substrate is in the inactive state it is substantially transparent to the colour changing radiation; that is it is substantially transparent to the initial colour changing radiation and the visible radiation. Advantageously, with such a method the colour change of the substrate can be achieved in a manner that significantly reduces accidental activation of inactive regions of the substrate during the colour transform process. This has an additional advantage of providing an arrangement that reduces the spread of colours achieved if the intensity distribution of the colour changing radiation is non uniform. For example, with a Gaussian intensity distribution one would expect the amount of material converted to a specific colour to be higher in the central region and lower in the outer regions. However, the use of visible colour transforming radiation that is only absorbed by the coloured material has the benefit that there is less material (with less thermal mass) to be heated and therefore the lower intensity provided at the outer region may be sufficient to effect the same, or at least similar, colour change to the central region.

The colour changing material may comprise a diacetylene material.

The initial colour changing radiation may cause a polymerisation of the colour forming material. The polymerisation may be a photonic process. The initial colour changing radiation may have a wavelength in the ultra violet region of the electromagnetic spectrum. The first colour may be blue.

The activation of the substrate may be permanent or reversible.

The step of activating a region of the substrate may involve heating the substrate above an activation temperature. This may be achieved by heating the substrate directly or by irradiating the region to be activated with suitable radiation.

The substrate may comprise an absorption material which absorbs radiation incident thereon. With such embodiments, the step of activating the substrate may comprise the step of irradiating the region of the substrate with an activating radiation which is absorbed by the absorption material. Preferably, the absorption material is in thermal contact with the colour forming material. With such an arrangement as the absorption material absorbs radiation and heats up it can transmit at least part of this thermal energy to the colour forming material in order to heat it. Preferably, the activating radiation has a wavelength in the infrared or near infrared regions of the electromagnetic spectrum.

Preferably, the colour changing radiation is absorbed directly by the colour forming material. Preferably, this includes both the initial colour changing radiation and the visible radiation. Advantageously, as opposed to arrangements wherein the colour changing radiation is absorbed by a dedicated absorber which transmits the energy to the colour forming material, with such a method the colour change of the substrate can be achieved in a manner that significantly reduces damaging the substrate when heating to higher temperatures to achieve certain colours.

The method may be self terminating. The self termination may mean that when a target temperature or colour change is reached the substrate becomes substantially transparent to the visible radiation. This means that subsequent exposure to the radiation will not cause any additional temperature increase or colour change.

Advantageously, such an arrangement at least partially reduces the spread of colours achieved if the visible radiation has a non uniform intensity distribution. For example, with a Gaussian intensity distribution one might expect the amount of material converted to a specific colour to be higher in the central region and lower in the outer regions. However, by using visible radiation of a suitable wavelength so that once a target colour is reached the substrate becomes substantially transparent to the visible radiation, when the central region has been converted to the target colour subsequent exposure to convert the outer region to the same target region will not effect any further colour change in the central region. Therefore, although different regions of the colour changing material may reach the target colour at different times, by irradiating for a sufficient exposure time a uniform colour may be achieved with a non-uniform beam intensity distribution.

The self termination may be achieved by tailoring the radiation pattern based on the absorption spectrum of the colour forming material. The absorption spectrum of the colour forming material may be temperature dependent. For example, the peak absorption wavelength may reduce with increasing temperature as is the case for a diacetylene. For such an embodiment, the method may be arranged to be self terminating by adjusting the wavelength of the visible radiation so that it corresponds to the longest wavelength that will just cause the permanent second colour transition.

Such an arrangement would limit any further heating and therefore minimise the energy input to the diacetylene or colour former and surrounding material. For a diacetylene material, the preferred wavelength for the blue to red self limiting colour change would be of the order of 600 nm. If a third colour is required then either a single, shorter wavelength source can be used (for example green, yellow, blue or violet) or a combination of one source of the order of 600 nm with another source of shorter wavelengths can be used. The second shorter wavelength could be chosen such that the self limiting heating also applies.

In one preferred embodiment, the substrate comprises a diacetylene and an infra red (IR) or near infra red (NIR) absorber. The diacetylene and the absorber are in thermal contact. The diacetylene and the absorber may be provided in a single mixed layer or, alternatively, they may each be provided as a separate layer. For such embodiments the activation may be achieved by irradiating the region with IR or NIR radiation; the IR or NIR radiation is absorbed by the absorber, the absorber heats up and transfers this energy to the part of the inactive diacetylene colour former that is in the vicinity by thermal conduction thus turning it into the active form.

Although, due to the presence of the IR or NIR absorber, IR or NIR radiation could be used to effect a colour change in some diacetylenes. However, by using colour changing radiation to which the inactive substrate is substantially transparent, as in the present invention, the accidental activation of adjacent regions of the substrate is avoided.

For embodiments wherein the substrate comprises a diacetylene and an IR or NIR absorber, the initial colour changing radiation preferably has a wavelength in the ultra violet range so that the colour changing radiation comprises UV radiation and visible radiation. At least part of the activated region of the substrate may be irradiated with UV radiation so as to effect a colour change of the diacetylene to the first colour, which is, preferably, blue. Once the diacetylene has been activated and illuminated by UV to form the first colour, the material naturally absorbs visible light, since it is coloured. Therefore, at least part of the diacetylene that has been colour changed to the first colour may be subsequently irradiated with a high energy density beam of visible electromagnetic radiation so as to effect a colour change of the diacetylene to a second colour (for example red) or a third colour (for example yellow) as desired or required.

Using colour changing radiation that is absorbed directly by the colour forming material rather than, for example, IR or NIR radiation that is absorbed by the absorber material has a number of advantages. For example, the process is more efficient since for a given colour change there is a reduced energy density (fluence) requirement as the energy is directly absorbed by the colour change material. Furthermore, the direct absorption allows for the temperature of the colour forming material to be raised to a higher level without damaging the surrounding substrate or materials. Furthermore, such an arrangement may at least partially reduce the spread of colours achieved if the intensity distribution of the colour changing radiation is non uniform.

The use of certain wavelengths of visible light offers various advantages as will be described below.

The absorption spectrum of the blue form DA peaks at around 650 nm, in the red region of the electromagnetic spectrum, where almost all of the incident red light is absorbed by the blue coloured DA material. This is therefore, arguably, the obvious choice of radiation to use to effect the colour change from the first colour to the second and third colours. It is therefore surprising that the use of this wavelength to transform the substrate from the first colour (blue) to the second colour (red) or third colour (yellow) is very inefficient, even at sufficiently high power densities. Typically, the fluence levels required to effect such a colour change with red light are in the range 10 $Jcm^{-2}$. Surprisingly, other visible wavelengths, particular in the region 400-560 nm and in particular 500-550 nm are significantly more efficient and are able to convert the first colour (blue) to second colour (red) or third colour (yellow) at much lower fluence levels (typically <1 $Jcm^{-2}$). The absorption spectrum of diacetylene materials is temperature dependent and the peak of the absorption spectrum shifts to lower wavelengths as the temperature of the diacetylene increases. This is thought to at least partially account for the advantageous efficiency associated with the above ranges of wavelengths.

The visible light may comprise a plurality of different wavelengths or wavelength ranges. The different wavelengths or wavelength ranges may irradiate the substrate substantially simultaneously or sequentially as required.

The visible light may comprise a combination of red light and another shorter wavelength, for example, a wavelength in one of the above ranges. For example, the visible light may comprise any or all of the following combinations: red and violet; red and green light; red and yellow; or red and blue; may offer significant benefits over single wavelength alternatives. This configuration allows for the possibility to use very low cost red laser to supply a significant portion of the energy to heat the substrate and use a lower power level of the shorter wavelength (for example green) to supply the remaining energy. Both wavelengths could be combined into a single fibre emitter or coupled through the same optical components to produce coincident focused spots on the substrate.

Although it is preferred for the colour changing radiation not to comprise the activation radiation wavelength(s), as will be obvious to one skilled in the art, the colour changing radiation may comprise a relatively small quantity of the activation radiation wavelength(s) whilst retaining at least some of the benefits of the present invention.

According to a second aspect of the present invention there is provided a method of marking a substrate that comprises a colour farming material, said method comprising the steps of: activating a region of the substrate so as to transform it from an inactive, low reactive state to an active, high reactive state; irradiating at least a part of the activated region with radiation to effect a colour change from an initial colour to a target colour characterised in that when the target colour is reached the substrate becomes substantially transparent to the radiation.

Such a method allows for a self terminating inkless printing technique. This means that subsequent exposure to the radiation will not cause any additional colour change or heating of the substrate.

Advantageously, such an arrangement at least partially reduces the spread of colours achieved if the visible radiation has a non uniform intensity distribution. For example, with a Gaussian intensity distribution one might expect the amount of material converted to a specific colour to be higher in the central region and lower in the outer regions. However, by using visible radiation of a suitable wavelength so that once a target colour is reached the substrate becomes substantially transparent to the visible radiation, when the central region has been converted to the target colour subsequent exposure to convert the outer region to the same target region will not effect any further colour change in the central region.

The method of the second aspect of the present invention may comprise any or all of the features of the method of the first aspect of the present invention as desired or required.

The radiation may comprise a high power density beam of visible electromagnetic radiation. Preferably, the power density of the beam of visible electromagnetic radiation is at least 10 $Wcm^{-2}$ and more preferably is at least 100 $Wcm^{-2}$. Preferably, the energy density of the beam of visible electromagnetic radiation is at least 0.1 $Jcm^{-2}$ and more preferably is at least 0.5 $Jcm^{-2}$.

The colour changing material may comprise a diacetylene material.

The self termination may be achieved by tailoring the radiation pattern on the absorption spectrum of the colour forming material. The absorption spectrum of the colour forming material may be temperature dependent. For example, the peak absorption wavelength may reduce with increasing temperature as is the case for a diacetylene. For such an embodiment, the method may be arranged to be self terminating by adjusting the wavelength of the visible radiation so that it corresponds to the longest wavelength that will just cause the permanent second colour transition. Such an arrangement would limit any further heating and therefore minimise the energy input to the diacetylene or colour former and surrounding material. For a diacetylene material, the preferred wavelength for the blue to red self limiting colour change would be of the order of 600 nm. If a third colour is required then either a single, shorter wavelength source can be used (for example green, yellow, blue or violet) or a combination of one source of the order of 600 nm with another source of shorter wavelengths can be used. The second shorter wavelength could be chosen such that the self limiting heating also applies.

The method may further comprise the step of irradiating the substrate with an initial colour changing radiation prior to irradiating the substrate with the radiation. The initial colour changing radiation may cause a polymerisation of the colour forming material. The polymerisation may be a photonic process. The initial colour changing radiation may have a wavelength in the ultra violet region of the electromagnetic spectrum.

The activation of the substrate may be permanent or reversible.

The step of activating a region of the substrate may involve heating the substrate above an activation temperature. This may be achieved by heating the substrate directly or by irradiating the region to be activated with suitable radiation.

The substrate may comprise an absorption material which absorbs radiation incident thereon. With such embodiments, the step of activating the substrate may comprise the step of irradiating the region of the substrate with an activating radiation which can be absorbed by the absorption material. Preferably, the absorption material is in thermal contact with the colour forming material. With such an arrangement as the absorption material absorbs radiation and heats up it can transmit at least part of this thermal energy to the colour forming material in order to heat it. Preferably, the activating radiation is in the infrared or near infrared regions of the electromagnetic spectrum.

According to a third aspect of the present invention there is provided a substrate marking apparatus, suitable for marking a substrate which includes material susceptible to changing colour upon irradiation, the apparatus comprising: an activation means for transforming selected regions of a substrate from an inactive, unreactive state to an active, reactive state; a radiation source that is operable to output a high power density beam of visible electromagnetic radiation; and a means for controlling emission of the radiation from the radiation source so as to controllably irradiate selected areas of the substrate so as to mark the substrate in a desired manner.

The apparatus of the third aspect of the present invention may comprise any or all of the features of the methods of the first or second aspects of the present invention as desired or required.

Such an apparatus allows for the methods of the first and second aspects of the present invention to be implemented.

Preferably, the radiation source is operable to output beam of visible electromagnetic radiation with an energy density of at least 0.1 $Jcm^{-2}$ and more preferably of at least 0.5. $Jcm^{-2}$. Preferably, the radiation source is operable to output beam of visible electromagnetic radiation with a power density of at least 10 $Wcm^{-2}$ and more preferably of at least 100 $Wcm^{-2}$.

The activation means may comprise a radiation source operable to output an activating radiation beam. Preferably, the activating radiation is in the infrared or near infrared region of the electromagnetic spectrum.

The substrate marking apparatus may be further operable to output radiation in other ranges of the electromagnetic spectrum. For example, the substrate marking apparatus may be operable to output UV radiation.

The substrate may comprise a diacetylene.

The beam of visible electromagnetic radiation may comprise a plurality of different wavelengths or wavelength ranges. The substrate marking apparatus may be operable to irradiate the substrate with the different wavelengths or wavelength ranges substantially simultaneously or sequentially as required. The plurality of wavelengths may be combined into a single fibre emitter or coupled through the same optical components to produce coincident focused spots on the substrate.

Preferably, the visible radiation comprises radiation in the region 400-560 nm. More preferably, the visible radiation comprises radiation in the range 500-550 nm. Advantageously, these ranges of radiation are particularly efficient for effecting colour changes in diacetylenes. In particular, they are able to convert blue form diacetylene to red and/or yellow at much lower fluence levels than other wavelengths.

The visible radiation may comprise radiation in the red region of the electromagnetic spectrum. Advantageously, red lasers are available at low cost.

Preferably, the visible radiation comprises a combination of red light and another shorter wavelength. For example, the visible light may comprise any or all of the following combinations: red and violet; red and green light; red and yellow; or red and blue. This configuration allows for the possibility to use very low cost red laser to supply a significant portion of the energy to heat the substrate and use a lower power level of the shorter wavelength (for example green) to supply the remaining energy.

In order that the present invention is more clearly understood, exemplary embodiments thereof will now be described, by way of example only and with reference to the accompanying drawings in which.

Figure 1A:
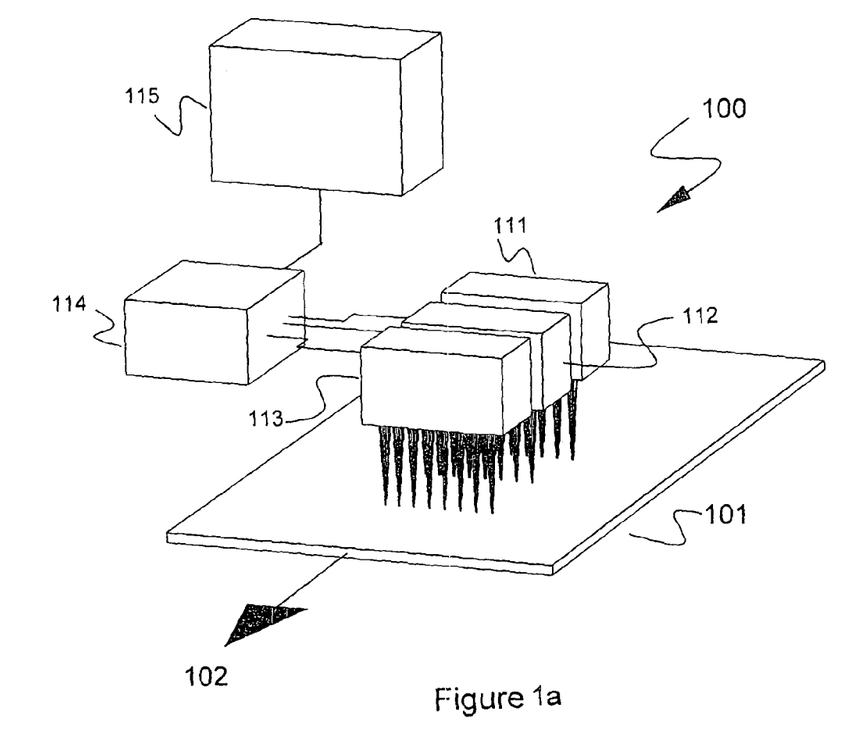
FIG. 1a shows a first embodiment of a substrate marking apparatus according to the present invention.

Turning now to FIG. 1a, a substrate marking apparatus 100 that is suitable for implementing the method of the present invention is shown. The apparatus 100 is suitable for marking a substrate 101 which includes material susceptible to changing colour upon irradiation, so as to form an image.

The substrate 101 comprises a base layer over which is provided a colour forming layer containing a diacetylene material. The colour forming layer may either also incorporate IR/NIR absorbing material or may be provided over a layer of IR/NIR absorbing material. The skilled man will of course appreciate that substrates doped with other materials susceptible to changing colour upon irradiation, may also be used.

Examples of diacetylenes from the state of the art which are particularly suitable for use with an apparatus according to the present invention are disclosed in WO2006018640, WO2009093028 and U.S. Pat. No. 6,524,000. Particularly preferred are those that can be reversibly activated between inactive and active forms using a stimulus as radiation, or irreversibly activated using for example melt-recrystallisation from an inactive form into an active form.

The apparatus 100 comprises three print heads 111, 112, 113, each print head 111, 112, 113 being a radiation source. Print head 111 comprises an array of IR/NIR emitters; print head 112 comprises an array of UV emitters or a flood illuminating UV source; and print head 113 comprises an array of high energy density visible (400-700 nm) emitters. In particular, print head 111 may comprise thermal contact print heads such as resistive or inductive heaters. The various individual emitters in each print head 111, 112, 113 are individually addressable and are individually controlled by a microprocessor 115 via drive amplifiers 114.

The microprocessor 115 is operable to convert a digital image file to a set of emission instructions for each print head 111, 112, 113. Typically, this involves mapping a particular pixel in the image file to a particular spot or area of the substrate; and determining the irradiation (duration and/or intensity) required from the individual emitters in each print head 111, 112, 113 to activate and change the colour of each spot or area of the substrate to a colour required by each image pixel.

The individual emitters in each print head array are provided with a dedicated radiation directing means. The directing means image each individual emitter to a spot on the surface of the substrate 101, such that a specific continuous (or discontinuous) pattern of irradiated spots is formed when each emitter is emitting. The dedicated radiation directing means comprises one or more lenses and/or one or more light guides as appropriate for each emitter. Typically, each print head 111, 112, 113 is adapted such that the array of emitters in combination with the dedicated radiation directing means forms a pattern of irradiated spots on the substrate 101. Accordingly, pixels in an image file may be mapped to one or more irradiated spots.

The microprocessor 115 is further operable to control the movement of substrate 101 relative to the print heads 111, 112, 113. This movement may take place in a single direction as indicated by arrow 102 in FIG. 1 or in multiple directions. Typically, the movement is achieved by movement of the substrate by indexed steps in the direction as indicated by the arrow 102 such that the area of spot pattern irradiated by print head 111 is subsequently moved to a position wherein it can be correspondingly irradiated by the spot pattern of print head 112 and is then subsequently moved to a position wherein it can be correspondingly irradiated by the spot pattern of print head 113. In alternative implementations, the print heads 111, 112, 113 may be movable in addition to or in place of movement of the substrate 101. For example, in addition to the movement of the substrate by indexed steps in the direction of the arrow 102, the print heads 111, 112, 113 may move in a direction which is substantially perpendicular to the arrow 102. The width of the print heads 111, 112, 113 may or may not extend across the full width of the substrate. Preferably, if the width of the print heads 111, 112, 113 is smaller than the width of the substrate, the print heads 111, 112, 113 are operable to move in a direction which is substantially perpendicular to the arrow 102 as described above. Additionally or alternatively, the substrate may move in a direction perpendicular to the direction 102 and the print heads move in the direction indicated by 102.

In use, the substrate 101 is thus sequentially exposed to radiation emitted by each print head 111, 112, 113 in turn, the irradiation of each area being determined by the radiation emitted by corresponding emitters of each print head 111, 112, 113. In the present embodiment, NIR/IR radiation emitted by print head 111 activates irradiated regions of the substrate 101 corresponding to the spot pattern of head 111. The NIR/IR radiation is absorbed by the NIR/IR absorbing material and the consequent rise in temperature activates diacetylene material from a low reactive state to a highly reactive state. Subsequently, exposure to irradiation by UV light from print head 112 effects initial polymerisation and colour change of the diacetylene material. The nature of the colour change is dependent upon the irradiation exposure. A further irradiation by visible radiation emitted by print head 113 then causes a conformational change in the diacetylene material. This can include a further colour change corresponding to the further irradiation exposure. A range of different distinct colours can thus be formed by irradiation of areas of the substrate 101 with an appropriate sequence of thermal radiation, UV and visible radiation.

Since only the areas of the substrate which are to be marked are exposed to the NIR/IR radiation, only those areas of the diacetylene material are activated from a low reactive or inactive state to a highly reactive state. As such, the light stability of other regions of the substrate which have not been so activated will be significantly improved relative to prior art techniques which do not utilise such an activation step. In particular, there is an improvement over prior art techniques only utilising a UV radiation source. As such, the substrate will be less prone to discolouration over time due to background/ambient light.

The use of the high energy density visible radiation emitted by print head 113 has several benefits over arrangements that only use combinations IR, NIR and UV radiation as set out below.

Once the first colour (typically blue) has been formed, the DA colour former absorbs visible wavelengths. Since this visible radiation is absorbed by the DA directly the process of heating the coloured material to a temperature which causes a second or third colour change is more effective. Furthermore, because the absorption at the appropriate wavelength is directly into the DA then it is possible to raise the temperature of the DA to a higher level without damaging the surrounding substrate or binding materials.

For example, to achieve the same colour change as radiation with a wavelength of 532 mm and fluence of 0.68 $Jcm^{-2}$, if NIR is used a fluence of 1.2 $Jcm^{-2}$ would be required and if using radiation with a wavelength of 660 nm a fluence of greater than 5 $Jcm^{-2}$ would be required.

The shift of the peak absorption wavelength to shorter wavelength as the temperature of the colour former increases can result in a self terminating process. If a fixed wavelength of visible radiation is employed then, due to the temperature dependence of its absorption spectrum, the material will become substantially transparent to the incident radiation at a particular temperature. This offers the possibility to adjust the visible wavelength so that it corresponds to the longest wavelength that will just cause the permanent second colour transition. Such an arrangement would limit any further heating and therefore minimise the energy input to the diacetylene or colour former and surrounding material. The preferred wavelength for the blue to red self limiting colour change would be of the order of 600 nm. If the third colour is required then either a single, shorter wavelength source can be used (for example green, yellow, blue or violet) or a combination of the first wavelength with a source of second, shorter wavelengths can be used. Again the second shorter wavelength should be chosen such that the self limiting heating also applies.

Preferable wavelengths for use by print head 113 include 380-450 nm (violet), 530-540 nm (green), 580-590 nm (yellow) and 630-650 nm (red). Any combination of these may be used. The use of a violet source with a wavelength of around 405 nm may be particularly convenient since, advantageously, 405 nm laser sources are more readily available, and available at a lower cost, than green and yellow laser sources.

An additional benefit to visible radiation is that if an acousto-optic device is used for scanning the beam then the RF power requirement is significantly lower. RF power in such devices is proportional to the square of the wavelength and thus operation at 532 nm will require ~⅑ of the RF power required compared to operating at 1550 nm. That is a power saving of an order of magnitude can be achieved. The use of a 405 nm violet laser source can offer a further power saving for embodiments which employ acousto-optic device(s) for scanning the visible beam.

A further benefit of visible wavelengths is that other light deflection or modulation technologies which are not suitable for NIR wavelengths, such as liquid crystal, may be applied.

For electro-optics scanning devices the required electro-optic coefficient for a particular resolution is proportional to wavelength and so the electro-optic coefficient or crystal size can be reduced by a factor equivalent to the ratio of visible to NIR wavelength. In the case of 532 nm and 1550 nm wavelengths this ratio corresponds to a reduction of ~⅓. The use of a 405 nm violet laser source can result in a further reduction in electro-optic coefficient for embodiments which employ electro-optic device(s) for scanning the visible beam.

There may also be benefits in the pattern of colours within each pixel that can be created by multiple visible wavelengths.

As the emitters in each print head 111, 112, 113 are individually controllable, the specific irradiation sequence experienced by each area of the substrate can be controllably varied, allowing a colour image to be formed.

Figure 1B:
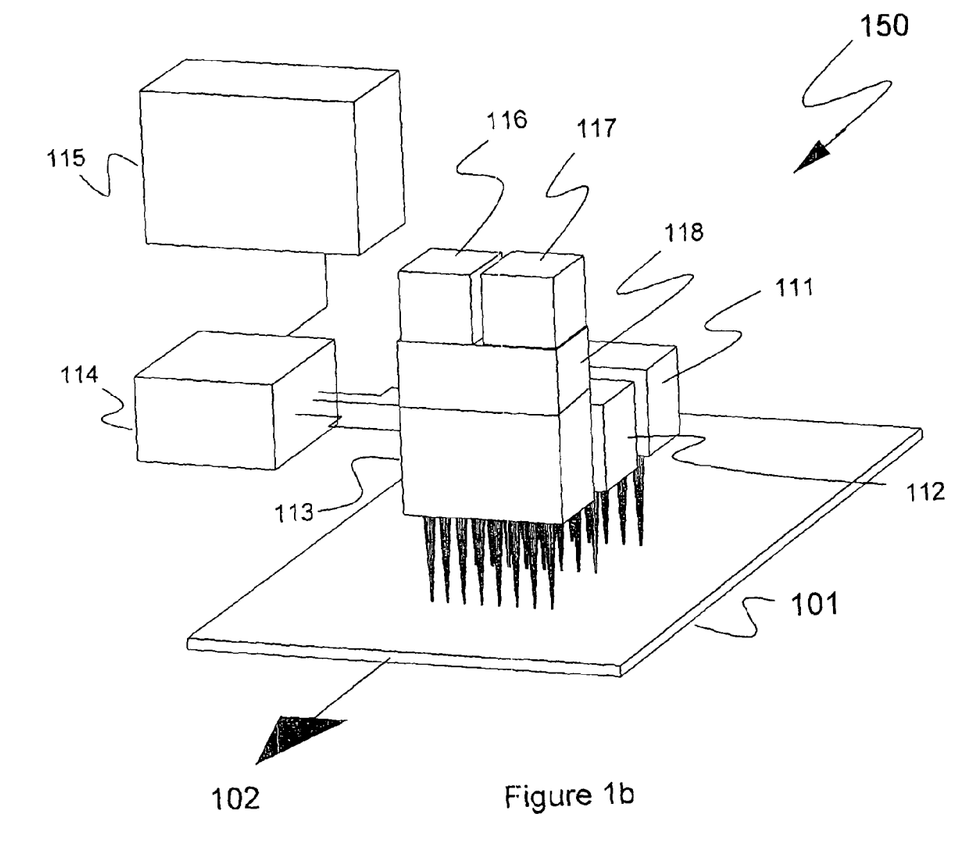
FIG. 1b shows a second embodiment of a substrate marking apparatus according to the present invention.

In another embodiment shown in FIG. 1b the visible emitter array 113 is connected to a unit 118 which combines two or more sources 116, 117 with different wavelengths into each emitter. For example source 116 may comprise a number of emitters operating at a first (typically red) wavelength range in the region 630-660 nm. This may be combined with sources 117 operating at a second wavelength range from 380-450 nm (violet), 500-550 nm (green) or 580-590 nm (yellow). The two sources are combined such that each emitter in array 113 is connected to at least one first emitter (red) source and at least one second emitter (violet, green or yellow) source.

This has the benefit that a substantially lower cost first wavelength range (red) source can be used to partially heat the colour former (diacetylene) to the intermediate, non permanent, coloured state and the coincident and substantially simultaneous second wavelength range (violet, green or yellow) source can be used to further heat the colour former to the final permanent state.

The method employed to combine the two or more wavelengths into each emitter may include any or all of the following as desired: dichroic mirrors, spliced fibres, diffraction gratings devices and prisms.

Figure 2:
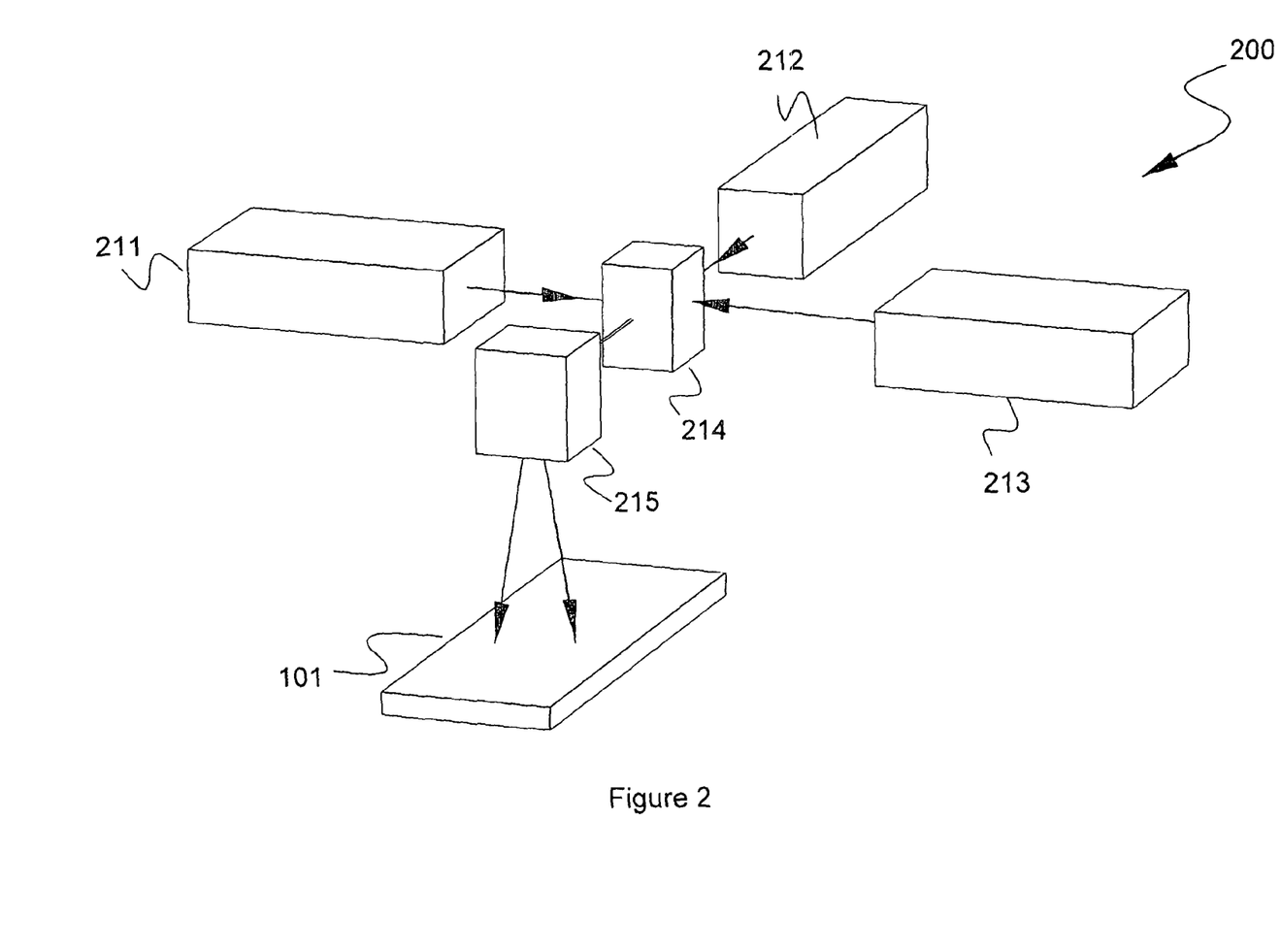
FIG. 2 shows a third embodiment of a substrate marking apparatus according to the present invention.

Turning now to FIG. 2 a further alternative embodiment of a substrate marking apparatus 200 is shown. In this embodiment a first radiation source 211 comprises a UV laser. A second radiation source 212 comprises an IR/NIR laser. A third radiation source 213 comprises a laser or LED emitting at least one visible wavelength. Alternatively, the third radiation source 213 could comprise two or more emitters of different wavelengths which are combined by suitable techniques. Each source 211, 212, 213 can be operated in a continuous or pulsed manner under the control of a microprocessor (not shown).

The radiation sources 211, 212, 213 all provide beams of radiation to a radiation combining element 214 operable to combine the separate emissions into a single beam. The beam combining element 214 may comprise any or all of the following: prisms, dichroic mirrors, spliced fibres or diffraction gratings.

The single combined beam can be imaged to a spot on the surface of substrate 101 by a radiation directing means 215. The radiation directing means 215 may be further operable to scan the coincident spot across the surface of the substrate 101 under the control of a microprocessor (not shown). The radiation directing means 215 may comprise any or all of: a galvanometer tilted mirror, an acousto-optic or electro-optic scanner, an MEMs beam deflector, a resonant scanner or a rotating polygon. The scanning of the spot across the surface of the substrate 101 may be achieved by movement of the radiation directing means 215 and/or the substrate 101. For example, for embodiments wherein the radiation directing means 215 comprises a resonant scanner and/or a rotating polygon, the substrate 101 may be moved relative to the radiation directing means 215.

As in the previous embodiments, the microprocessor is operable to convert a digital image file to a set of emission instructions for each source 211, 212, 213 and the directing means 215. Typically, this involves mapping a particular pixel in the image file to a particular spot or area of the substrate; and determining the irradiation (duration and/or intensity) required from the individual sources 211, 212, 213 to change the colour of each spot or area of the substrate to a colour required by each image pixel. By appropriate sequencing of the emissions from each source 211, 212, 213 incident on a particular spot on the surface of the substrate 101, the colour of the spot can be controlled. Subsequently, by scanning the beam over the substrate 101 using the radiation directing means 215 an image can be built up over the full substrate 101.

The apparatus 200 can be operated in any suitable sequence. For instance, each spot of the substrate may be simultaneously exposed to radiation from both sources 211, 212 and subsequently exposed to source 213 or may be sequentially exposed to pulses of radiation from each source 211, 212, and 213. In particular, in a pulsed embodiment, the sequence of exposure may be IR/NIR radiation; UV radiation; visible radiation in a similar manner to that described in the first embodiment above. In sequential exposure, the sequence may be applied on a spot by spot basis such that one spot is exposed to the full sequence before the beam is scanned to a next spot. Alternatively, the sequence may be applied on a line by line or area by area basis wherein each exposure step in the sequence is applied in turn to each spot in a line or area of spots by scanning the beam from spot to spot before the subsequent exposure steps are applied to each spot in the line or area.

Whilst the three embodiments of the apparatus 100, 150, 200 can obviously be used for inkless printing on a suitable substrate 101, each apparatus may also be applied to any other suitable task including, for example, the formation of conducting features within a suitable dielectric coating or substrate.

It is of course to be understood that the present invention is not to be limited to the details of the above embodiment which is described by way of example only.

For example although the above embodiments relate to substrates comprising a diacetylene material, as will be appreciated by one skilled in the art, the apparatus and methods of the present invention are also applicable to other materials with similar properties.

The invention claimed is:

1. A method of marking a substrate that comprises a colour forming material, said method comprising the steps of:
    activating a region of the substrate so as to transform said colour forming material in said region from an inactive, low reactive state to an active, high reactive state, wherein the step of activating does not require a photoinitiator and does not effect a colour change, wherein the step of activating a region of the substrate involves heating the substrate above an activation temperature either by heating the substrate directly or by irradiating the region to be activated with suitable radiation;
    irradiating at least a part of the activated region with an initial colour changing radiation to effect an initial colour change to a first colour; and
    irradiating at least a part of the substrate that has been changed to the first colour with a high power density beam of visible electromagnetic radiation to effect a further colour change of the irradiated region to a second colour,
    wherein the method is self-terminating so that when a target temperature is reached the colour forming material becomes substantially transparent to the visible radiation.

2. A method as claimed in claim 1 wherein the self-termination is achieved by tailoring the radiation pattern based on the absorption spectrum of the colour forming material.

3. A method as claimed in claim 2 wherein the wavelength at the peak of the absorption spectrum decreases with increasing temperature and wherein the method comprises the step of adjusting the wavelength of the visible radiation so that it corresponds to the longest wavelength that will just cause the permanent second colour transition.

4. A method of marking a substrate that comprises a colour forming material, said method comprising the steps of:
- activating a region of the substrate so as to transform said colour forming material in said region from an inactive, low reactive state to an active, high reactive state, wherein the step of activating does not require a photoinitiator and does not effect a colour change, wherein the step of activating a region of the substrate involves heating the substrate above an activation temperature either by heating the substrate directly or by irradiating the region to be activated with suitable radiation; and
- irradiating at least a part of the activated region with radiation to effect a colour change from an initial colour to a target colour,
- characterised in that when the target colour is reached the colour forming material becomes substantially transparent to the radiation;
- wherein the radiation comprises a high power density beam of visible electromagnetic radiation.

5. A method as claimed in claim 4 wherein the method further comprises the step of irradiating the substrate with an initial colour changing radiation prior to irradiating the substrate with the radiation.

6. A method as claimed in claim 5 wherein the initial colour changing radiation is in the ultra violet region of the electromagnetic spectrum.

7. A method as claimed in claim 4 wherein the substrate further comprises an absorption material which absorbs radiation incident thereon and wherein the step of activating the substrate comprises the step of irradiating the region of the substrate with an activating radiation which is absorbed by the absorption material.

8. A method of marking a substrate that comprises a colour forming material, said method comprising the steps of:
- activating a region of the substrate so as to transform said colour forming material in said region from an inactive, low reactive state to an active, high reactive state, wherein the step of activating does not require a photoinitiator and does not effect a colour change, wherein the step of activating a region of the substrate involves heating the substrate above an activation temperature either by heating the substrate directly or by irradiating the region to be activated with suitable radiation; and
- irradiating at least a part of the activated region with radiation to effect a colour change from an initial colour to a target colour,
- characterised in that when the target colour is reached the colour forming material becomes substantially transparent to the radiation;
- wherein the self absorption spectrum of the colour forming material is temperature dependent and wherein the wavelength at the peak of the absorption spectrum decreases with increasing temperature and wherein the method comprises the step of adjusting the wavelength of the radiation so that it corresponds to the longest wavelength that will just cause the permanent second colour transition.

9. A method of marking a substrate that comprises a colour forming material, said method comprising the steps of:
- activating a region of the substrate so as to transform said colour forming material in said region from an inactive, low reactive state to an active, high reactive state, wherein the step of activating does not require a photoinitiator and does not effect a colour change, wherein the step of activating a region of the substrate involves heating the substrate above an activation temperature either by heating the substrate directly or by irradiating the region to be activated with suitable radiation;
- irradiating at least a part of the activated region with an initial colour changing radiation to effect an initial colour change to a first colour; and
- irradiating at least a part of the substrate that has been changed to the first colour with a high power density beam of visible electromagnetic radiation to effect a further colour change of the irradiated region to a second colour,
- wherein the method is self terminating so that when a target colour change is reached the colour forming material becomes substantially transparent to the visible radiation.

* * * * *